United States Patent [19]
Asanuma et al.

[11] 4,369,838
[45] Jan. 25, 1983

[54] DEVICE FOR RELEASING HEAT

[75] Inventors: Yoshihiko Asanuma; Yoshihumi Shimajiri, both of Tochigi, Japan

[73] Assignee: Aluminum Kabushiki Kaisha Showa, Osaka, Japan

[21] Appl. No.: 153,582

[22] Filed: May 27, 1980

[51] Int. Cl.³ .......................... F28F 7/00; H01L 23/36
[52] U.S. Cl. ...................................... 165/185; 357/81; 361/386; 29/157.3 R; 174/16 HS
[58] Field of Search ...................... 165/179, 181, 185; 357/81; 361/386; 29/157.3 R, 157.3 A, 157.3 B; 174/16 HS

[56] References Cited
U.S. PATENT DOCUMENTS

| | | | |
|---|---|---|---|
| 3,187,812 | 6/1965 | Staver | 174/16 HS X |
| 3,202,212 | 8/1965 | Kritzer | 165/179 |
| 3,217,793 | 11/1965 | Coe | 165/185 X |
| 3,222,764 | 12/1965 | Hansson et al. | 29/157.3 A |
| 3,981,354 | 9/1976 | Haberski | 165/179 X |

Primary Examiner—Albert W. Davis, Jr.
Attorney, Agent, or Firm—Armstrong, Nikaido, Marmelstein & Kubovcik

[57] ABSTRACT

A heat releasing device comprising a base plate integrally formed with a multiplicity of tongue-like raised fins on at least one side thereof by skiving, each of the skived fins being divided at least at its forward end into a plurality of portions by slits.

3 Claims, 12 Drawing Figures

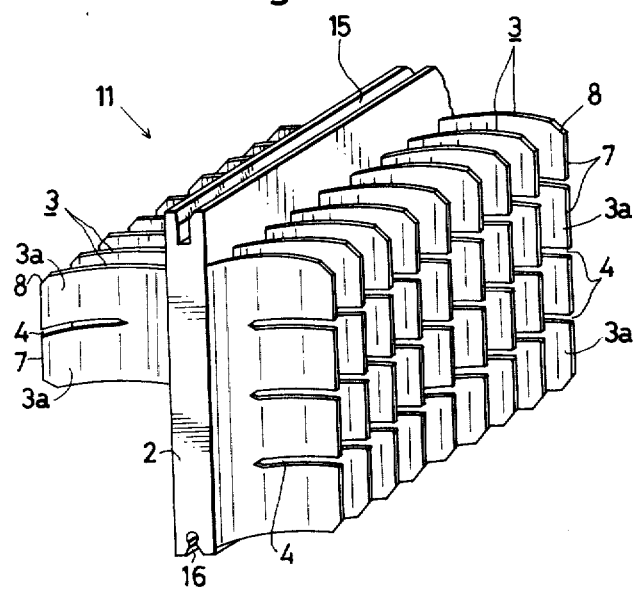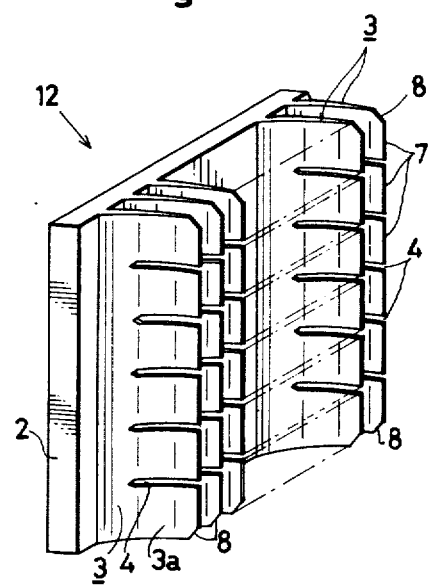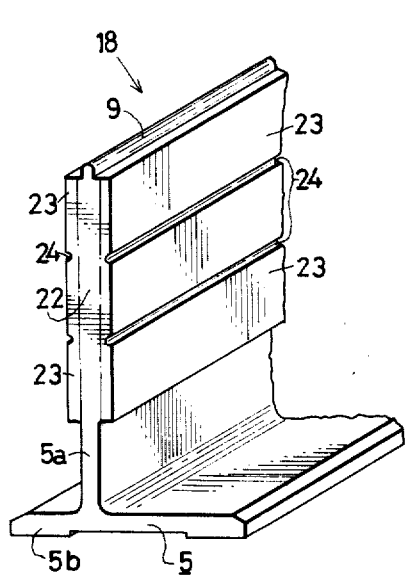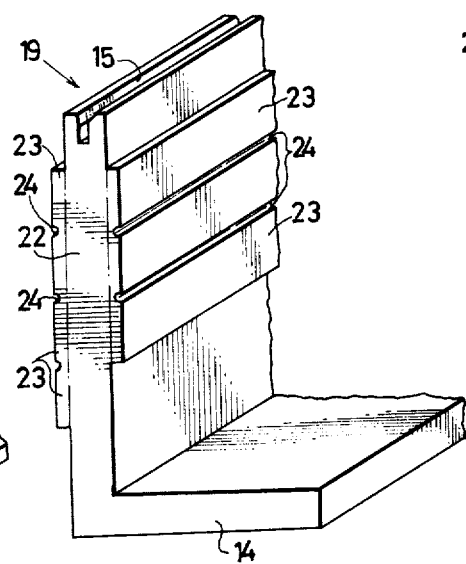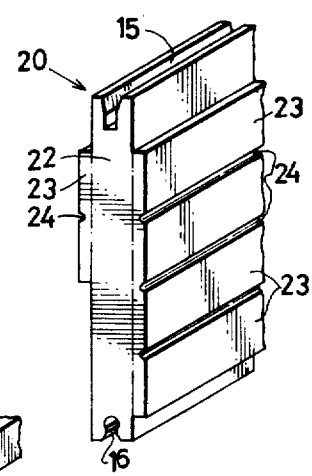

4,369,838

DEVICE FOR RELEASING HEAT

BACKGROUND OF THE INVENTION

This invention relates to a device for effectively releasing heat from apparatus having transistors or like semiconductors incorporated therein.

Devices of this type, so-called heat sinks, are usually chiefly made of extruded shaped materials. Also known are devices comprising a heat pipe or a press-shaped plate, and those made by die casting or brazing. Heat releasing devices made of extruded materials are more advantageous than others in heat releasing efficiency, manufacturing cost, etc. and are widely used but have the following problems.

(1) Audio amplifiers provided with power transistors, etc., for example, involve heat loss which increases with an increase in output. To preclude thermal damage to semiconductor components, there is basically a need to increase the effective outer surface area of the heat releasing device with the increase of the output. However due to limitations on the cross sectional area of the extruded material or to the limitation imposed by the height of the amplifier case, the device is actually used as divided into a plurality of segments.

(2) The extrusion technique involves such a limitation that when the pitch of fins is 5 to 10 mm, the height of the fins is up to 3 to 3.5 times the pitch.

(3) The extrusion technique involves the requirement that the heat releasing device, even when having a relatively small cross section, should be at least about 1 to 1.5 mm in wall thickness. Devices of larger cross section, when not having a wall thickness of 2 to 3 mm, are not extrudable or fail to fulfill the specifications due to warping, twist or the like. Thus the extruded device is likely to be heavier.

SUMMARY OF THE INVENTION

The main object of the present invention is to provide a heat releasing device free of the foregoing problems.

The heat releasing device of this invention is characterized in that it comprises a radiating base plate integrally formed with a multiplicity of tongue-like raised fins on at least one side thereof by skiving, each of the skived fins being divided at least at its forward end into a plurality of portions by slits.

The heat releasing device of this invention has a high heat releasing efficiency, so that even when only one device is attached, for example, to an audio amplifier, transistors and like heat emitting components can be fully cooled. Since the tongue-like fins are formed by skiving, the fins can be of reduced thickness. This renders the device exceedingly lighter than like conventional devices made by extrusion, consequently making it possible to provide electronic apparatus in a reduced overall size.

BRIEF DESCRIPTION OF THE DRAWINGS

FIG. 4 is a fragmentary perspective view showing another embodiment of the invention;

FIG. 5 is a fragmentary perspective view showing another embodiment of the invention;

FIGS. 7 to 10 are perspective views showing the blanks to be made into the devices of FIGS. 1, 3, 4 and 6, respectively, according to the invention;

DESCRIPTION OF THE PREFERRED EMBODIMENTS

Figure 1:
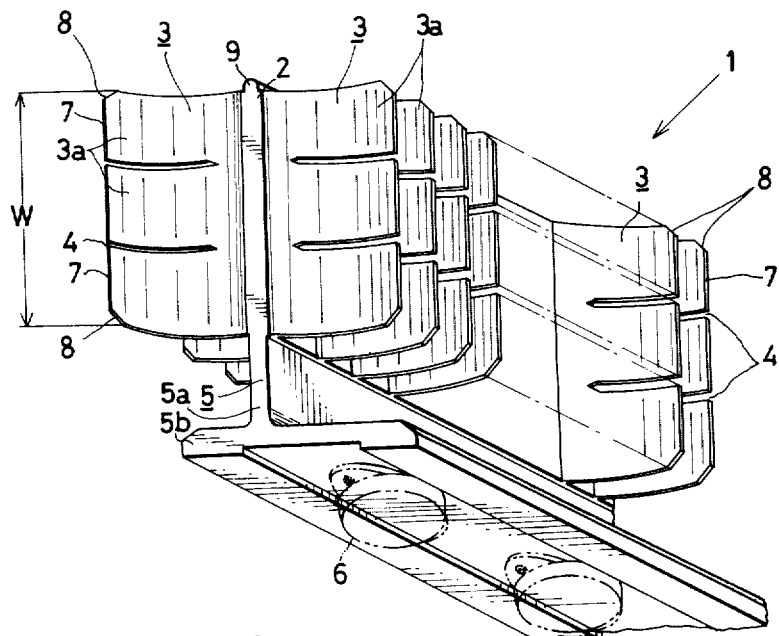
FIG. 1 is a fragmentary perspective view showing an embodiment of this invention.
Figure 2:
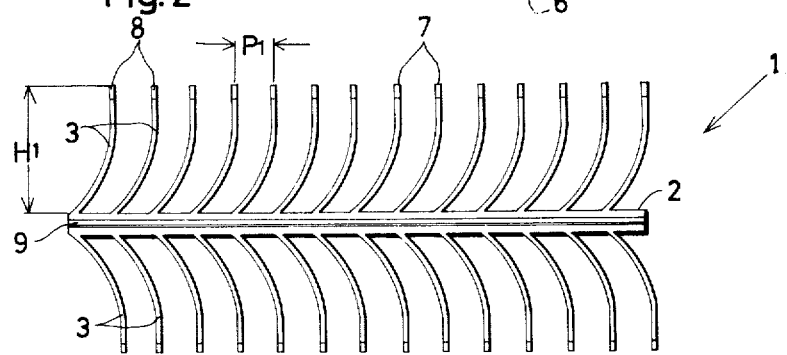
FIG. 2 is a plan view showing the same.

With reference to FIGS. 1 and 2, a heat releasing device 1 comprises a radiating base plate 2 made from an aluminum extruded blank and a multiplicity of tongue-like raised fins 3 formed on each side of the base plate 2 by skiving the blank and arranged side by side. A mount 5 for heat emitting elements 6, which has an inverted T-shaped cross section and comprises a vertical portion 5a and a horizontal portion 5b, extends from the lower edge of the base plate 2. The horizontal portion 5b is formed on its lower side with a recess extending longitudinally thereof. Two transistors, namely, heat emitting elements 6 are fitted in the recess and intimately attached to the recessed bottom wall with screws. Each of the tongue-like fins 3 formed by cutting has two slits 4 except at its base portion and is thereby divided into three portions 3a.

The skived fins 3 are spaced apart from one another and preferably have a pitch of 4 to 10 mm. The divided portions 3a of the fin 3 have a width of 8 to 25 mm. The skived fins 3 have a height of 15 to 50 mm. With the skived fins 3 thus dimensioned, the heat releasing device 1 achieves the highest heat releasing efficiency.

The skived fin 3 is sharp-edged at its forward end when raised from the blank by cutting. To assure safety for handling, the sharp edge is cut off vertically to provide a flat face 7 at the forward end of the fin 3, and the opposed corners of the forward end of the fin are chamfered to form downwardly obliquely slanting faces 8 continuous with opposite ends of the flat face 7. Accordingly there is little or no likelihood that the device 1, when being incorporated into a stereophonic amplifier or the like, will cut the hand of the worker. Thus the device is made extremely safe to handle. With the thin sharp edges cut off from the forward ends of the skived fins 3, the fins 3 are unlikely to release thin fragments that would cause trouble to the apparatus.

A projection 9 provided on the upper edge of the radiating base plate 2 serves to smoothly slidingly guide a cutter for cutting the sharp edges from the skived fins 3 to form properly finished forward ends for the fins 3.

Since the mount 5 is formed integrally with the radiating base plate 2 at one side thereof, the heat emitting element 6 is replaceable very conveniently without the necessity of removing the device 1 itself from the apparatus, such as stereophonic amplifier. The provision of the mount 6 serves to reinforce the apparatus.

Figure 3:
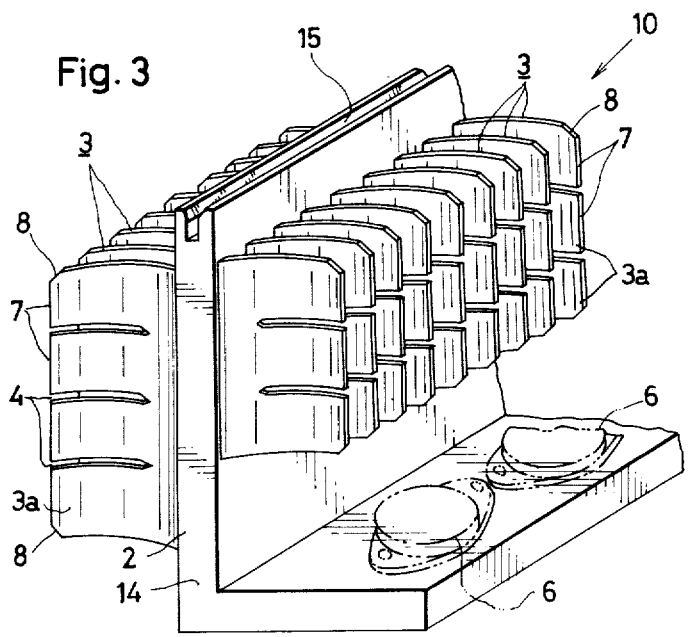
FIG. 3 is a fragmentary perspective view showing another embodiment of the invention.

FIG. 3 shows another heat releasing apparatus 10 comprising a radiating planar base plate 2 made from an extruded aluminum blank and a multiplicity of skived fins 3 formed on each side of the plate 2. A mount 14 for heat emitting elements 6 which has an approximately L-shaped cross section extends from the lower edge of the radiating base plate 2. The heat emitting elements 6, i.e. transistors, are intimately attached with screws to the upper surface of a horizontal portion of the mount. Of the skived fins 3 on both sides of the base plate 2, those on the left side of the drawing are provided in a raised position as arranged in parallel substantially over the entire area of one side of the base plate 2 and are each formed with three slits 4 at intermediate portions. The skived fins 3 on the other side of the base plate 2 are arranged side by side in a raised position over the portion other than the lower marginal portion of the other side and have ¾ the size of the fins on the left side. To assure safety in handling, each of the skived fins 3 has at its forward end a flat face 7 and slanting faces 8 at opposite ends of the face 7. The base plate 2 is formed in its upper edge with a groove 15 for slidingly guiding an unillustrated device for cutting the forward ends of the fins.

When the device 10 is attached to a wall of the case of an amplifier or the like, the heat emitted by the transistors or like heat emitting elements 6 is released from the skived fins 3 and is also delivered to the wall of the case for dissipation.

FIG. 4 shows another heat releasing device 11 comprising a radiating base plate 2 made from an extruded aluminum blank and formed with a multiplicity of tongue-like skived fins on each side of the base plate 2. Of these skived fins 3, those on the right side of the drawing are arranged in parallel in a raised position substantially over the entire area of one side of the base plate 2 and are each formed with three slits 4. The fin 3 is divided into four portions except at its base portion. The fins 3 on the other side are provided in a raised position on an upper portion of that side and are each formed with one slit 4. They have one half the size of the fins 3 on the right side. To assure safety in handling, each of the skived fins 3 has at the forward end thereof a flat face 7 and slanting faces 8 continuous with opposite ends of the face 7.

The radiating base plate 2 is provided in its upper and lower edges with grooves 15 and 16 respectively for slidingly guiding an unillustrated device for cutting the forward ends of the fins. Of these grooves 15 and 16, the lower groove 16 includes a portion of substantially circular cross section for screws to be driven in at both ends of the groove 16. Unillustrated transistors or like heat emitting elements are attached to the side where the tongue-like fins 3 are not provided on the plate 2.

FIG. 5 shows a heat releasing device 12 comprising a radiating planar base plate 2 made from an aluminum extrudate and formed with a multiplicity of skived fins 3 on one side thereof. Each of the skived fins 3 has five slits 4 at intermediate portions and is divided into six except at its base portion. Transistors or like heat emitting elements are attached to the other side of the base plate 2 provided with no skived fin 3. To assure safety in handling, the skived fin 3 is formed at its forward end with a flat face 7 and slanting faces 8 at opposite ends of the face 7. Although at least one edge of the base plate 2 is preferably provided with a projection 9 or a groove 15 or 16 for guiding a cutter as in the foregoing embodiments, it is possble to cut the forward ends of the fins 3 with a suitable cutter without resorting to the provision of such a projection 9 or groove 15 or 16.

Figure 6:
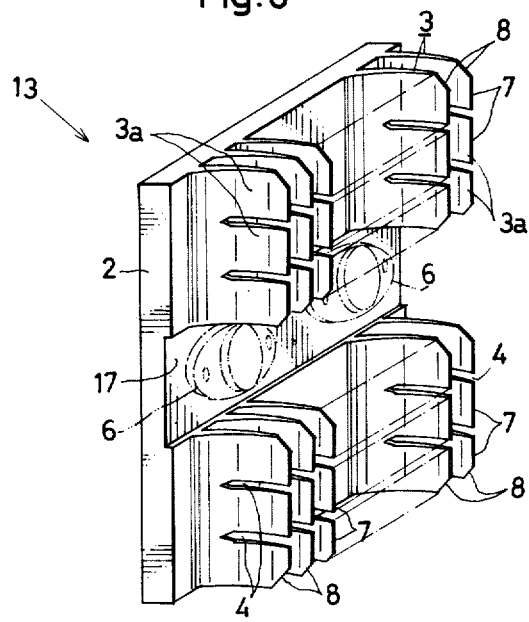
FIG. 6 is a fragmentary perspective view showing still another embodiment of the invention.
Figure 10:
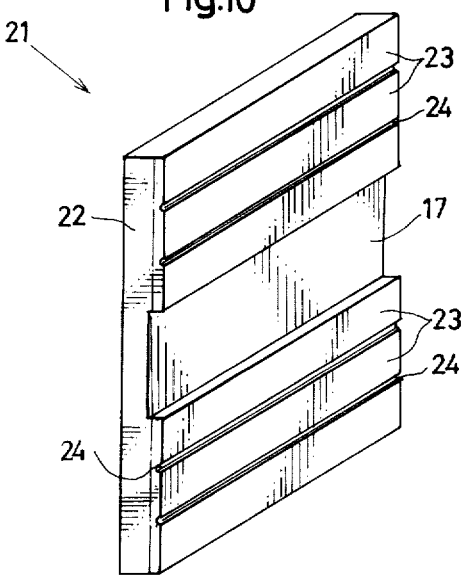

FIG. 6 shows another heat releasing device 13 comprising a radiating planar base plate 2 made from an extruded aluminum blank and formed on one side thereof with a multiplicity of skived fins 3 in divided rows along opposite edges thereof. A mount 17 for heat emitting elements 6 is provided between the two rows of skived fins 3. Each of the skived fins 3 has two slits 4 at intermediate portions thereof and is divided into three except at its base portion. Since the heat emitting elements 6, such as transistors, are adapted to be attached to the midportion of the width of the device 13 with the multiplicity of skived fins 3 provided on opposite sides of the elements 6, the heat from the elements 6 are dividedly delivered to the two rows of fins 3 for dissipation. The device 13 therefore achieves an exceedingly high heat releasing efficiency.

The heat releasing devices 1, 10, 11 and 13 described above are made from extruded aluminum blanks as shown in FIGS. 7 to 10 by cutting the blanks 18, 19, 20 and 21. Each of the blanks 18 to 21 has a base plate forming portion 22 and a fin forming portion on one or each side of the portion 22. The fin forming portion includes a required number of projections 23 extending longitudinally of the portion 22 and arranged in parallel as spaced apart from one another by a lengthwise groove 24. The fin forming portion of the blank is cut transversely leaving the thickness of the base plate forming portion 22 uncut, whereby a multiplicity of tongue-like fins 3 are formed. At this time, the fin forming portion is cut beyond the lengthwise grooves 24 inward to a portion indicated in a broken line, so that each of the raised skived fins 3 formed has a continuous base portion and the other portion divided into a plurality of parts by the slits 4. When the lengthwise grooves 24 are deeper, longer slits will be formed, with the result that each of the resulting fins 3 comprises a plurality of completely divided segments.

After the multiplicity of skived fins 3 have been formed, the sharp edge of each fin 3 is removed from its forward end to provide a flat face 7, and opposite corners of the forward end are chamfered to form slanting faces 8. While the lengthwise grooves 24 are formed when the blank is prepared by extrusion, the grooves may be formed by preparing a plate-like blank and thereafter grooving the blank.

The heat releasing devices 1, 10, 11, 12 and 13 according to the invention were tested to determine the pitches of the fins, $P_1$, which achieved the highest heat releasing efficiency at varying heights of the fins, $H_1$. Table 1 shows the results.

TABLE 1

| Height of fins ($H_1$, mm) | Pitch of fins ($P_1$, mm) | |
|---|---|---|
| | Entire width of fins W ≧ 50 | Entire width of fins W < 50 |
| 15 | 5.5–6.5 | 4–5 |
| 25 | 6.5–7.5 | 5–6 |
| 38 | 8–9 | 6.5–7.5 |

Figure 11:
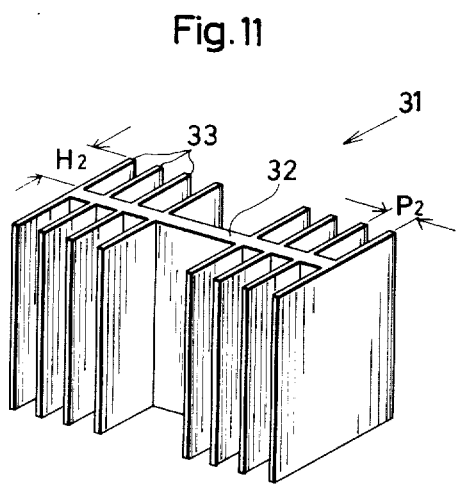
FIG. 11 a perspective view showing a conventional heat releasing device.

FIG. 11 shows a conventional heat releasing h respect to the device 31, the limits of the height of the fins, $H_2$, that can be manufactured at varying pitches of fins, $P_2$, were determined. Table 2 shows the results.

TABLE 2

| Pitch of fins ($P_2$, mm) | Limit of height of fins ($H_2$, mm) |
|---|---|
| 5 | 15–16 |
| 6 | 18–20 |
| 7.5 | 23–26 |

Tables 1 and 2 reveal that the present invention affords heat releasing devices having higher fins than the conventional devices and therefore assuring a higher heat releasing efficiency. According to the invention, the tongue-like fins of the device are formed by cutting a blank and can be made thinner. This serves to render the device lighter.

The heat releasing device of this invention is preferably colored black, for example, by subjecting the device to a sulfuric acid alumite treatment and thereafter filling the resulting pores with a black dye, or by chemically oxidizing the surface of the device with deionized water and treating the resulting film with an aqueous coloring solution containing a molybdate and a nickel salt or like metallic salt to color the film black. Table 3 shows examples of chemical treatments for forming a black film.

Figure 12:
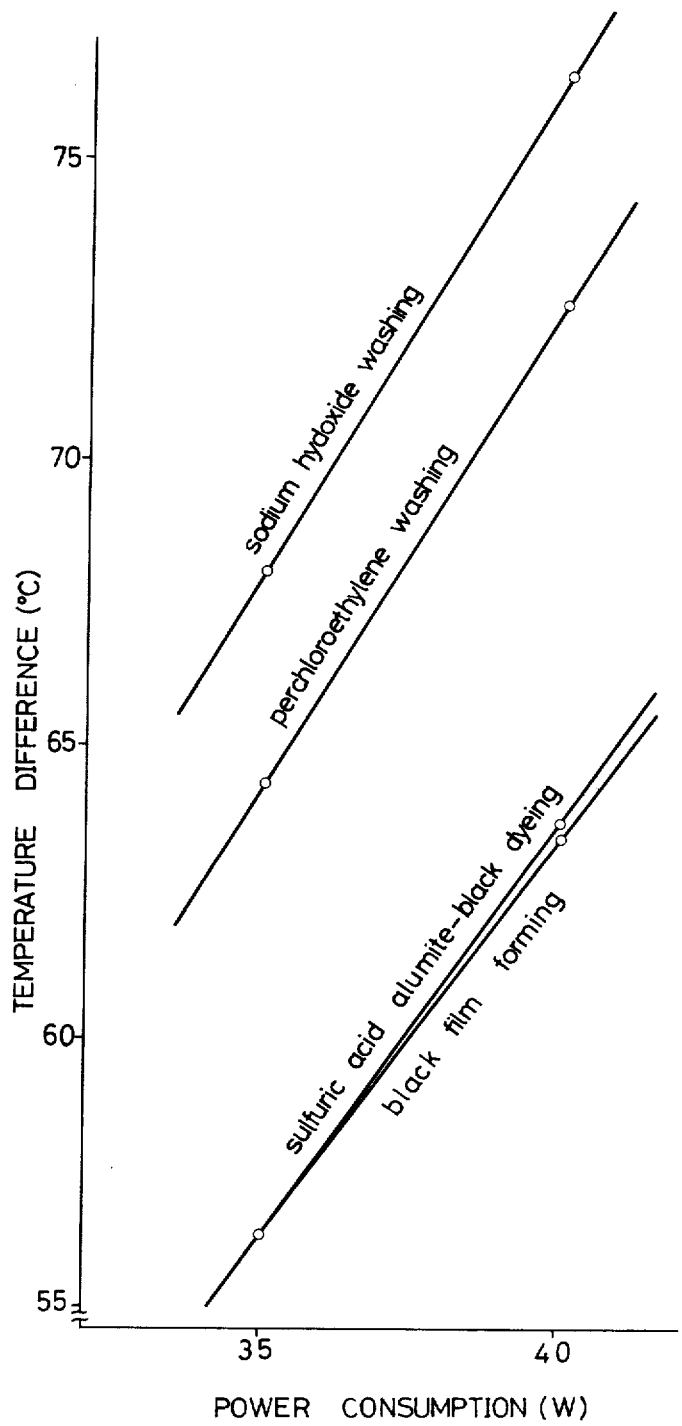
FIG. 12 is a graph showing the results obtained by testing heat releasing devices for heat releasing efficiency in terms of the relation between the power consumption and the difference in temperature.

Heat releasing devices thus colored black and uncolored heat releasing devices (one washed with sodium hydroxide and another washed with perchloroethylene) were tested for heat releasing efficiency for comparison. The results are shown in FIG. 12, in which the temperature difference is the difference between the temperature of transistors and room temperature. The difference resulted from the release of heat. It is seen that the devices subjected to the sulfuric acid alumite-black dyeing treatment or to the black film forming chemical treatment have exceedingly higher heat releasing efficiency than the uncolored devices.

TABLE 3

| Treating conditions | Example 1 | Example 2 |
|---|---|---|
| Film forming treatment | | |
| Treating liquid | Deionized water | Deionized water containing 0.3 vol. % of triethanolamine |
| Temperature (°C.) | 70 | 70 |
| Time (min) | 5 | 5 |
| Coloring treatment | | |
| Ammonium molybdate tetrahydrate (g/l) | 10 | 5 |
| Ammonium nickel sulfate hexahydrate (g/l) | 5 | 3 |
| Temperature (°C.) | 80 | 70 |
| Time (min) | 10 | 20 |
| Color | Black | Black |

The heat releasing devices 1, 10, 11, 12 and 13 of this invention are useful for cooling heat emitting elements comprising semiconductors, such as transistors, thyristors (SCR), diodes, etc.

The skived fins 3 on the radiating base plate 2 are not limited in shape to those of the foregoing embodiments but can be shaped otherwise. The devices 1, 10, 11, 12 and 13, which are made of aluminum, may be made from some other metal.

This invention may be embodied differently without departing from the spirit or basic features of the invention. Accordingly the embodiments herein disclosed are given for illustrative purposes only and are not in any way limitative. It is to be understood that the scope of the invention is defined by the appended claims rather than by the specification and that various alterations and modifications within the definition and scope of the claims are included in the claims.

What is claimed is:

1. A heat releasing device comprising a radiating base plate integrally formed with: a multiplicity of tongue-like raised fins spaced apart from each other by a distance of 4–10 mm and having a height of 15–50 mm, on at least one side of the base plate by skiving, each of the skived fins being divided at least at its forward end into a plurality of portions by at least one slit to form divided portions each having a width of 8–25 mm on each fin; and a mount for attaching heat emitting elements which is provided with a horizontal portion, extending at a right angle from the lower edge of the radiating base plate, heat emitting elements being intimately attached to said horizontal portion; wherein the radiating base plate is formed from an extruded blank and the skived fins are formed by cutting a fin forming portion having a plurality of projections provided with a lengthwise groove interposed therebetween, on at least one side of the blank.

2. A device as defined in claim 1 wherein each of the skived fins has at its forward end a flat face formed by removing a sharp edge from the end.

3. A device as defined in claim 2 wherein at least one of opposite side edges of the radiating base plate is provided with a projection or groove for guiding a device for cutting the forward ends of the fins.

* * * * *